United States Patent
Kanda et al.

(10) Patent No.: US 8,099,653 B2
(45) Date of Patent: Jan. 17, 2012

(54) COMMUNICATION APPARATUS AND METHOD INCLUDING A PLURALITY OF DESCRAMBLERS

(75) Inventors: Tetsuo Kanda, Kawasaki (JP); Tadashi Eguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1139 days.

(21) Appl. No.: 11/909,687

(22) PCT Filed: Apr. 27, 2006

(86) PCT No.: PCT/JP2006/309202
§ 371 (c)(1),
(2), (4) Date: Sep. 25, 2007

(87) PCT Pub. No.: WO2006/123542
PCT Pub. Date: Nov. 23, 2006

(65) Prior Publication Data
US 2009/0063936 A1    Mar. 5, 2009

(30) Foreign Application Priority Data
May 19, 2005  (JP) ................................. 2005-146985

(51) Int. Cl.
*H03M 13/00* (2006.01)
(52) U.S. Cl. ........................................ 714/776; 714/795
(58) Field of Classification Search .................. 714/776, 714/795
See application file for complete search history.

(56) References Cited

U.S. PATENT DOCUMENTS

| | | | | |
|---|---|---|---|---|
| 6,069,621 A * | 5/2000 | Schupak | ...................... | 715/717 |
| 6,442,129 B1 * | 8/2002 | Yonge et al. | .................. | 370/204 |
| 6,587,948 B1 * | 7/2003 | Inazawa et al. | ............... | 713/193 |
| 7,139,243 B2 | 11/2006 | Okumura | | |
| 7,162,682 B2 * | 1/2007 | Lewis | .......................... | 714/776 |
| 7,286,669 B2 * | 10/2007 | Nishizaki | ...................... | 380/255 |
| 7,379,547 B2 * | 5/2008 | Kawamae et al. | ............ | 380/201 |
| 7,626,640 B2 * | 12/2009 | Toida | ............................ | 348/725 |
| 7,773,752 B2 * | 8/2010 | Noh | ............................... | 380/239 |
| 7,903,722 B2 * | 3/2011 | Keel et al. | ..................... | 375/148 |
| 2004/0170121 A1 * | 9/2004 | Kim et al. | ..................... | 370/208 |
| 2007/0121946 A1 * | 5/2007 | Ito et al. | ....................... | 380/270 |

FOREIGN PATENT DOCUMENTS

| | | |
|---|---|---|
| JP | 7-135508 A | 5/1995 |
| JP | 8-265304 A | 10/1996 |
| JP | 2001-186108 A | 7/2001 |
| JP | 2002-158642 A | 5/2002 |
| JP | 2003-032161 A | 1/2003 |
| WO | 2005-006639 A | 1/2005 |

OTHER PUBLICATIONS

Multiband OFDM Physical Layer Proposal for IEEE 802.15 Task Group 3a, Sep. 14, 2004 p. 15-37, retrieved Jul. 25, 2006, htttp://www.wimedia.org/imwp/idms/popups/pop_download.asp?ContentID=6516.

* cited by examiner

*Primary Examiner* — James C Kerveros
(74) *Attorney, Agent, or Firm* — Canon U.S.A., Inc. IP Division

(57) ABSTRACT

A communication apparatus includes a plurality of descramblers for subjecting a second header portion of a received frame to descrambling processing using pseudo-random sequences that differ from one another; a plurality of syndrome arithmetic units for performing a syndrome calculation, which is in accordance with a cyclic redundancy check code, with respect to headers descrambled by respective ones of the plurality of descramblers, and an error correction unit for selecting a header that has been descrambled by one descrambler among the plurality of descramblers as a receive header, in accordance with syndrome values calculated by respective ones of the plurality of syndrome arithmetic units.

17 Claims, 9 Drawing Sheets

F I G. 6A
F I G. 6B
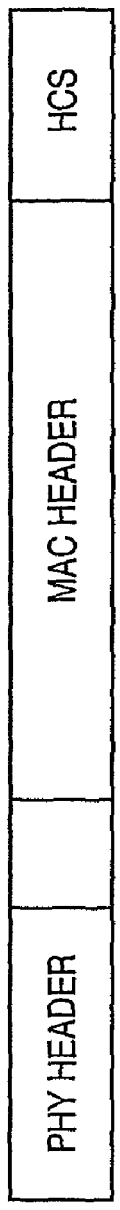
F I G. 6C
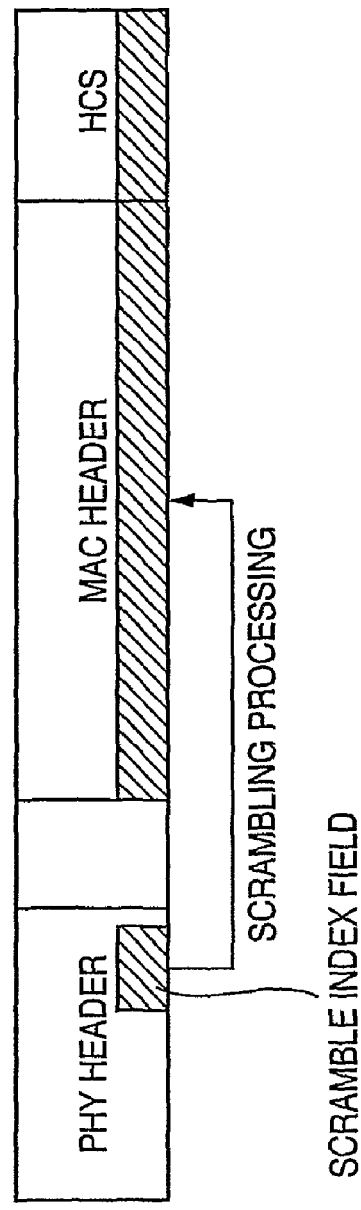
F I G. 6D

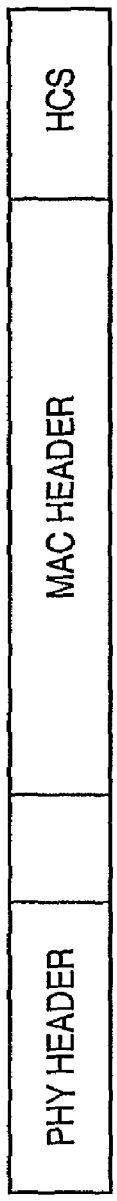
F I G. 8A
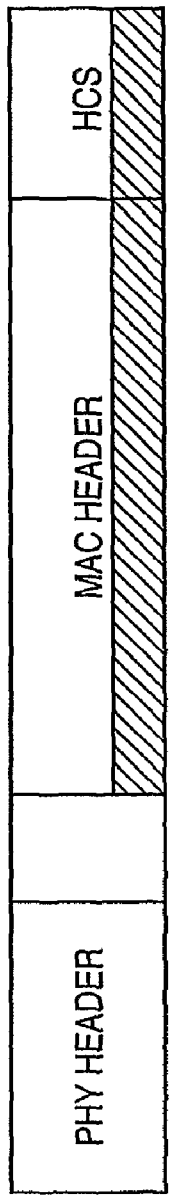
F I G. 8B
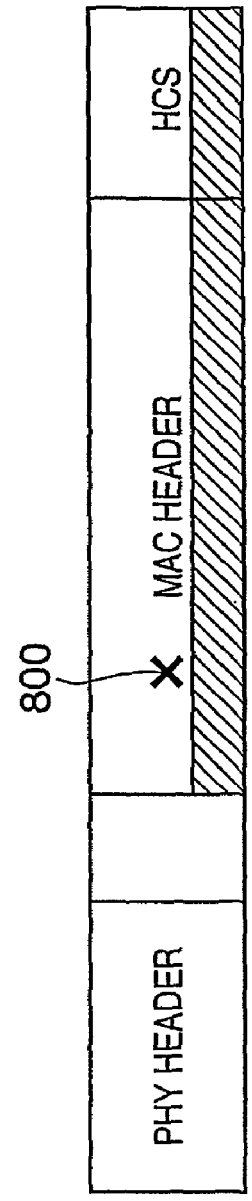
F I G. 8C
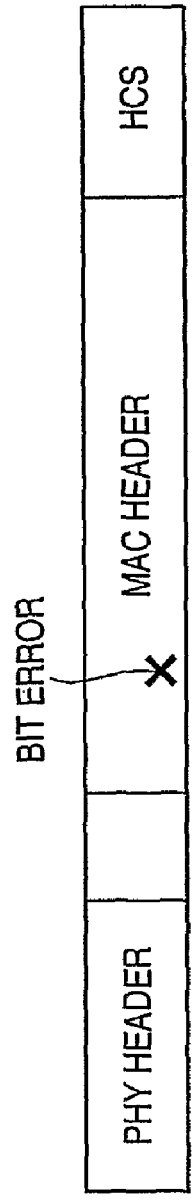
F I G. 8D

COMMUNICATION APPARATUS AND METHOD INCLUDING A PLURALITY OF DESCRAMBLERS

TECHNICAL FIELD

This invention relates to a communication apparatus for performing data communication between devices, a method of reception in this apparatus, a codec, a decoder, a communication module, a communication unit and a decoding method.

BACKGROUND ART

At present, the planning of standards is proceeding as the IEEE 802.15 group of standards in relation to WPAN. With regard to network topology and media-access protocols, specifications have already been decided in the IEEE 802.15.3 standard. Furthermore, MBOA specifications and DS-UWB specifications, etc., based on UWB (Ultra-Wide Band) communication schemes have been proposed as high-speed WPAN standards.

FIG. 3 is a diagram illustrating the structure of a wireless frame in a WPAN system proposed in specifications.

As illustrated, the WPAN wireless frame is composed of a header 300 and data payload 301. The header 300 contains information necessary for protocol processing in the PHY or MAC layer. User data is transported by the data payload 301. The header 300 and data payload 301 include checksums, which are referred to as header check sequence (HCS) and frame check sequence (FCS), respectively, for the purpose of error detection or error correction.

FIG. 4 is a diagram useful in describing in further detail the header 300 included in the wireless frame of the WPAN system proposed in MBOA specifications.

The header 300 includes a PHY header 400 that holds the frame length of the wireless data frame, the data transfer rate and other wireless frame information as the PHY layer, and a MAC header 401 that holds a terminal identifier related to the MAC protocol. Furthermore, placed between the PHY header 400 and the MAC header 401 is a tail bit 402 in order to return a convolutional encoder in the transmitter and a Viterbi decoder in the receiver to their initial states. Further, an HCS 403 is appended to the end of the frame as a checksum for detecting or correcting an error that has occurred in the PHY header 400 or MAC header 401. The checksum used here is a CRC (Cyclic Redundancy Check) code based upon the generating polynomial $G(X)=X^{16}+X^{12}+X^5+1$. Bit error that has occurred in the header 300 can be detected or corrected using the code characteristic of the HCS.

With the basic method of error detection and error correction based upon this CRC code, first division based upon the generating polynomial $G(X)$ is performed over the entirety of the message portion and checksum, and then the remainder is found. In the case of a 16-bit CRC code, for example, the remainder is a 16-bit value and generally is referred to as a "syndrome". If the syndrome is "0", then it is guaranteed that the message and checksum are entirely free of error. If the syndrome is not "0", on the other hand, detection or correction of the error that has occurred can be performed using a syndrome value that is non-zero ($\neq 0$) but the number of error bits capable of being detected or corrected is dependent upon the code characteristic of the CRC code used. It is known that the polynomial $G(X)$ used here makes possible 1-bit error correction and error detection of up to three bits.

Japanese Patent Laid-Open No. 2001-186108 can be mentioned as a conventional example of an error detection or error correction method using a CRC code. In Japanese Patent Laid-Open No. 2001-186108, rather than calculating a syndrome directly with respect to a received sequence and applying an error correction based upon this value in the manner described above, maximum-likelihood decoding, in which it is assumed that an error has occurred at each bit position in the receive data sequence, is performed. More specifically, a decoder is equipped with a plurality of bit-inverting circuits, the number of which is the same as that of the code block lengths of the receive data, and with the same number of CRC circuits. Each of the bit inverting circuits forcibly inverts the symbol at the corresponding bit position in the receive data sequence, the outputs of the bit-inverting circuits are subjected to syndrome computations by respective ones of the plurality of CRC circuits, and a path for which the result of computation is "0" is adopted as decoded data, whereby the speed of error-correction/error-detection processing is raised.

Furthermore, Japanese Patent Laid-Open No. 7-135508 can be mentioned as a conventional example of an error detection or error correction method using a CRC code. This relates to a cell synchronization scheme with a distributed sample scrambler used in cell-based ATM (Asynchronous Transfer Mode). This method subjects an ATM cell header to error correction using a CRC code contained in this header and simultaneously synchronizes the operation timing of a descrambler to the data payload. Similarly, in a WPAN communication scheme compliant with the MBOA specifications, a checksum based upon a CRC code is appended to the header and scrambling processing using a scrambler is applied to the latter half of the header and to the data payload. Accordingly, even in a conventional WPAN communication system compliant with the MBOA specifications, header error correction is implemented by using a codec having a configuration similar to that of the well-known art.

FIG. 5 is a block diagram useful in describing the structure of a transmit-side codec in a WPAN wireless communication system compliant with MBOA specifications, and FIGS. 6A to 6D are diagrams useful in describing output data at various portions of a transmit-side codec.

A codec is provided together with a modem processing unit in a processor of the PHY layer and applies channel encoding to transmit data that has been accepted from a MAC processor. The transmit-side codec first accepts a PHY parameter 11 relating to the PHY layer and, in a PHY header generator 101, generates a PHY header of the kind shown in FIG. 6A in accordance with the decided format. Next, the generated PHY header, a tail bit and a MAC header accepted from the MAC processor are concatenated in a header concatenating unit 102 in accordance with the decided format. FIG. 6B depicts the structure of data thus generated and output from the header concatenating unit 102.

An HCS is generated by an HCS generator 103. The HCS generator 103 calculates an HCS as a CRC code by the generating polynomial $G(X)=X^{16}+X^{12}+X^5+1$ with regard to the PHY header, tail bit and MAC header and adds the calculated 16-bit HCS to the latter part of the MAC header, as illustrated in FIG. 6C.

Furthermore, the header and data payload are subjected to scrambling processing by a scrambler 104. The latter is implemented by an exclusive-OR operation between a pseudo-random sequence, which is generated by a polynomial $X^{15}+X^{14}+1$, and the header and data payload. What is noteworthy here is that the PHY header and tail bit among the constituent elements of the header are not subjected to scrambling processing and that only the portion from the MAC header onward is subjected to scrambling processing, as illustrated in FIG. 6D. Furthermore, with regard to the initial state of the scrambler compliant with MBOA specifications, one is selected from among four types on a per-wireless-frame basis, and the generated pseudo-random sequence also is selected from among four types. Such a pseudo-random sequence used in scrambling processing is referred to as a "scramble pattern". In order to identify the scrambler initial value selected at this time, a 2-bit field (scrambler seed field) within the PHY header is assigned as a scramble index field. As a result, by referring to this field, the receiver is capable of applying an operation that is the reverse of scrambling, namely descrambling processing, to the receive data using an identical scramble pattern generated from an initial state identical with that on the transmit side. If descrambling is performed in the receiver using a scramble pattern different from that of the transmit side, receive data that is completely different from the transmit data will be reproduced. This means that it is essential that the scramble patterns used on the transmit and receive sides match each other. In accordance with the MBOA specifications, scramble pattern information is shared using the scramble index field in order to achieve agreement between the scramble patterns of the transmitter and receiver.

The scrambled header and data payload are subsequently convolutionally encoded by a convolutional encoder 105 at an encoding rate that corresponds to the prescribe data transfer rate. Furthermore, in order to maintain the error correction capability manifested by the convolutional code with respect to the occurrence of burst error, the encoded data is interleaved on the frequency axis by an interleaver 106. Modulated data 13 thus channel encoded by the codec on the transmit side is delivered to a modem (not shown) and subjected to OFDM modulation, after which the data is transmitted as a UWB radio signal from an antenna via a radio frequency circuit.

FIG. 7 is a diagram illustrating the structure of a conventional receive-side codec in a WPAN wireless communication system compliant with MBOA specifications.

The receive-side codec first accepts demodulated data 21 from a modem and, using a deinterleaver 204, performs data rearrangement as an operation that is the reverse of interleaving at the time of transmission. Next, in order to decode convolutional code, decoding is performed typically by a Viterbi-algorithm decoder (Viterbi decoder 205). The decoded data 22 thus obtained is descrambled with regard to the portion of the header from the MAC header onward and with regard to the data payload by a descrambler 201. According to the MBOA specifications, one of four types of scramble initial values is selected, as described above. The descrambler on the receive-side codec acquires the initial value of the scrambler being used in the receive frame from the scramble index field that has been assigned to the PHY header of the header, and executes descrambling by an exclusive-OR operation with respect to the pseudo-random sequence.

Next, the output of the descrambler 201 is sent to a syndrome arithmetic unit 202 in order that error correction based upon a CRC code will be performed. The syndrome arithmetic unit 202 performs division, which is based upon the above-mentioned generating polynomial, over the PHY header, tail bit, MAC header and HCS and calculates the remainder as a syndrome. If the syndrome value thus calculated is "0", then it is guaranteed that the received frame header is entirely free of error. In a case where the syndrome value is not "0", on the other hand, a correction is performed by an error correction unit 203, which is connected to the output side of the syndrome arithmetic unit 202, if there is an error of one bit. If an error exceeding a single bit exists, the wireless frame is discarded on the grounds that the number of errors is such that the errors cannot be corrected. Receive data 23 thus error corrected is sent to a MAC processor.

Thus, with a conventional codec, correction of bit error contained in a header is performed using a CRC code. However, in a case where a bit error has occurred in the scramble index field contained in the PHY header, even an error that is one bit at most, a conventional codec will cause the descrambler 201 to operate based upon an improper scramble pattern and, as a result, apparent error spreads over the entire header.

FIGS. 8A to 8D are diagrams for describing a case where error correction can be performed correctly using a CRC code employing the conventional codec.

FIG. 8A illustrates a header before scrambling and FIG. 8B the header after scrambling. As described above, only the portion of the header from the MAC header onward is subjected to scrambling processing. FIG. 8C illustrates the received header. Here, as indicated at 800, a bit error has occurred in part of the scrambled MAC header. FIG. 8D illustrates the descrambled header. Here the position 800 at which the bit error occurred is maintained as is.

In a case where an error has thus occurred in a bit other than the scramble index field contained in the PHY header, the receive data is descrambled correctly by a scramble pattern identical with the scramble pattern used at the time of transmission. As a result, there is no change in the number bits in which the error occurred or in the bit positions even in the descrambler output. Even in a case where an error has occurred in a field (the MAC header, etc.) that is to undergo scrambling processing, scrambling/descrambling processing is a linear operation, namely an exclusive-OR operation between the scramble pattern and a data sequence. The number of bit errors and positions, therefore, are maintained. In such case error detection/correction can be performed normally by the conventional codec.

FIGS. 9A to 9D are diagrams for describing a case where error correction cannot be performed correctly using a CRC code employing the conventional codec.

FIG. 9A illustrates a header before scrambling and FIG. 9B the header after scrambling. As described above, only the portion of the header from the MAC header onward is subjected to scrambling processing (shown as a shaded portion in FIG. 9B). FIG. 9C illustrates the received header. Here, as indicated at 900, a bit error has occurred in the scramble index field within the PHY header, which does not undergo scrambling. FIG. 9D illustrates the descrambled header. Here bit error has spread across the entire header owing to non-agreement with the scramble pattern.

If a bit error thus occurs in the scramble index field contained in the PHY header, the descrambler of the receive-side codec decides the scramble pattern, which is to be used in descrambling, by referring to the scramble index field in which the error is included. Consequently, the scramble pattern used in descrambling becomes a scramble pattern that is different from the pattern that was used by the scrambler at the time of transmission. Since improper descrambling processing is thus executed by a scramble pattern different from that used in scrambling processing at the time of transmission, apparent bit error is enlarged in the descrambler output.

The header that has thus undergone improper descrambling by the descrambler is no longer one that can be subjected to normal error correction in the syndrome arithmetic unit and error correction unit located downstream. As a result, even if bit error that has occurred in the scramble index field is a single bit that is within the error correction capability of a CRC code, error correction can no longer be performed correctly. Further, this may bring about erroneous decisions of other types and may lead to a rise in the rate at which wireless frames are lost.

DISCLOSURE OF INVENTION

Accordingly, an object of the present invention is to eliminate the shortcomings of the prior art described above.

Further, a feature object of the present invention is to suppress an affect of an error operation by a descrambler, even in a case where bit error has occurred in a scramble index field contained in first header information of a header.

According to the present invention, there is provided with a communication apparatus for communicating a frame having a header that includes a first header portion and a second header portion that has been scrambled, the apparatus comprising:

a plurality of descramblers, each of which is configured to apply different descrambling processing to the second header portion of a received frame;

a plurality of syndrome arithmetic units configured to perform a syndrome calculation with respect to headers descrambled by respective ones of the plurality of descramblers; and a selector configured to select a header that has been descrambled by one descrambler among the plurality of descramblers, as a receive header, in accordance with syndrome values calculated by respective ones of the plurality of syndrome arithmetic units.

Further, according to the present invention, there is provided with a method of receiving a frame having a header that includes a first header portion and a second header portion that has been scrambled, the method comprising:

a plurality of descrambling steps of applying different descrambling processing to the second header portion of a received frame;

a plurality of syndrome calculation steps of performing a syndrome calculation with respect to headers descrambled in respective ones of the plurality of descrambling steps; and a selection step of selecting a header that has been descrambled in one descrambling step among the plurality of descrambling steps as a receive header, in accordance with syndrome values calculated in respective ones of the plurality of syndrome calculation steps.

It should be noted that the summary of the invention does not set forth all necessary components of the present invention. Therefore, combinations of the components are also to become inventions.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate an embodiment of the invention and, together with the description, serve to explain the principles of the invention.

FIGS. 6A to 6D are diagrams useful in describing output data at various portions of a transmit-side codec;

FIGS. 8A to 8D are diagrams for describing a case where error correction can be performed correctly using a CRC code employing the conventional codec.

BEST MODE FOR CARRYING OUT THE INVENTION

A preferred embodiment of the present invention will now be described in detail with reference to the accompanying drawings. It should be noted that the embodiment below does not limit the present invention set forth in the claims and that not all of the combinations of features described in the embodiment are necessarily essential as means for attaining the objects of the invention.

Figure 1:
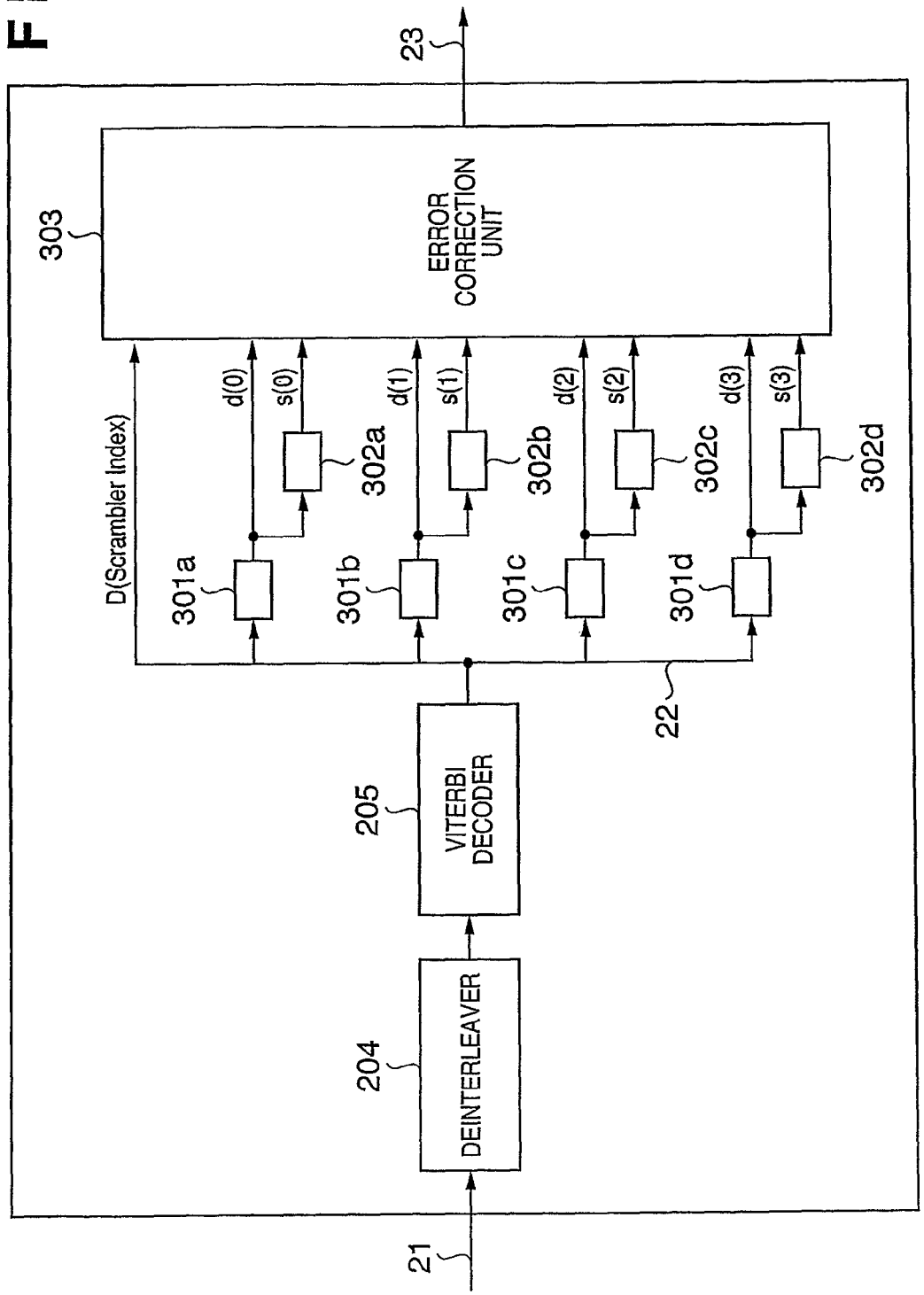
FIG. 1 is a block diagram for describing the structure of a receive-side codec according to an embodiment of the present invention.

FIG. 1 is a block diagram for describing the structure of a codec in a wireless communication unit disposed in a receive-side wireless communication apparatus according to an embodiment of the present invention.

A receive-side codec according to this embodiment accepts demodulated data 21 from a modem (not shown), subjects the demodulated data 21 to deinterleave processing using a deinterleaver 204 and decodes the demodulated data using a Viterbi decoder 205. The decoded data 22 (D in FIG. 1) that is output from the Viterbi decoder 205 is composed of a header and data payload. However, since this embodiment relates primarily to processing concerning the header, processing involving the header will be described in particular below.

The feature of this embodiment resides in a plurality of descramblers 301 (301a to 301d) and a plurality of syndrome arithmetic units 302 (302a to 302d), as illustrated in FIG. 1.

A wireless frame in this embodiment is assumed to be one that is compliant with the MBOA specifications. Accordingly, this wireless frame is subjected to scrambling processing and is transmitted in the manner described above. In scrambling performed at the time of transmission, one of four types of scramble patterns is used. Furthermore, in order to identify the scramble pattern on the receive side, a two-bit value is held as a scramble index field in the PHY header contained in the decoded data D. Here it is assumed that identification is achieved by numerical values "0" (00) to "3" (11), in conformity with the two bits, as four types of scramble indices, as shown in FIG. 1.

The four descramblers 301a, 301b, 301c, 301d in this embodiment ignore the scramble index value contained in the decoded data D and execute descrambling processing using scramble patterns indicated by the scrambling indices of "0" to "3"(described in the PHY header), respectively. In other words, the first descrambler 301a, for example, forcibly replaces the scramble index field contained in the decoded data D with a 2-bit value (00) representing the scramble index value "0". Furthermore, the first descrambler 301a subjects the data field from the MAC header onward to descrambling processing using the scramble pattern identified by the scramble index "0". The first descrambler 301a outputs d(0) as first descrambled data resulting from this processing.

Further, the second descrambler 301b forcibly replaces the scramble index field contained in the decoded data D with a 2-bit value (01) representing the scramble index value "1". Furthermore, the second descrambler 301b subjects the data field from the MAC header onward to descrambling processing using the scramble pattern identified by the scramble index value "1". The second descrambler 301b outputs d(1) as second descrambled data resulting from this processing.

Similarly, the third descrambler 301c forcibly replaces the scramble index field contained in the decoded data D with a 2-bit value (10) representing the scramble index value "2". Furthermore, the third descrambler 301c subjects the data field from the MAC header onward to descrambling processing using the scramble pattern identified by the scramble index value "2". The third descrambler 301c outputs d(2) as third descrambled data resulting from this processing.

Finally, the fourth descrambler 301d forcibly replaces the scramble index field contained in the decoded data D with a 2-bit value (11) representing the scramble index value "3". Furthermore, the fourth descrambler 301d subjects the data field from the MAC header onward to descrambling processing using the scramble pattern identified by the scramble index value "3". The fourth descrambler 301d outputs d(3) as fourth descrambled data resulting from this processing.

The syndrome arithmetic units 302a, 302b, 302c and 302d execute division based upon a CRC code over the PHY header, tail bit, MAC header and HCS with respect to the descrambled data d(0), d(1), d(2) and d(3), respectively, and output the remainders, which result from these calculations, as four syndromes S(0), S(1), S(2) and S(3).

The codec in this embodiment further includes an error correction unit 303. The latter is supplied with the four items of descrambled data d(0), d(1), d(2), d(3), the four syndromes S(0), S(1), S(2), S(3) and the scramble index field contained in the decoded data D. The error correction unit 303 decides the descrambled data in accordance with an algorithm in line with the flowchart illustrated in FIG. 2.

Figure 2:
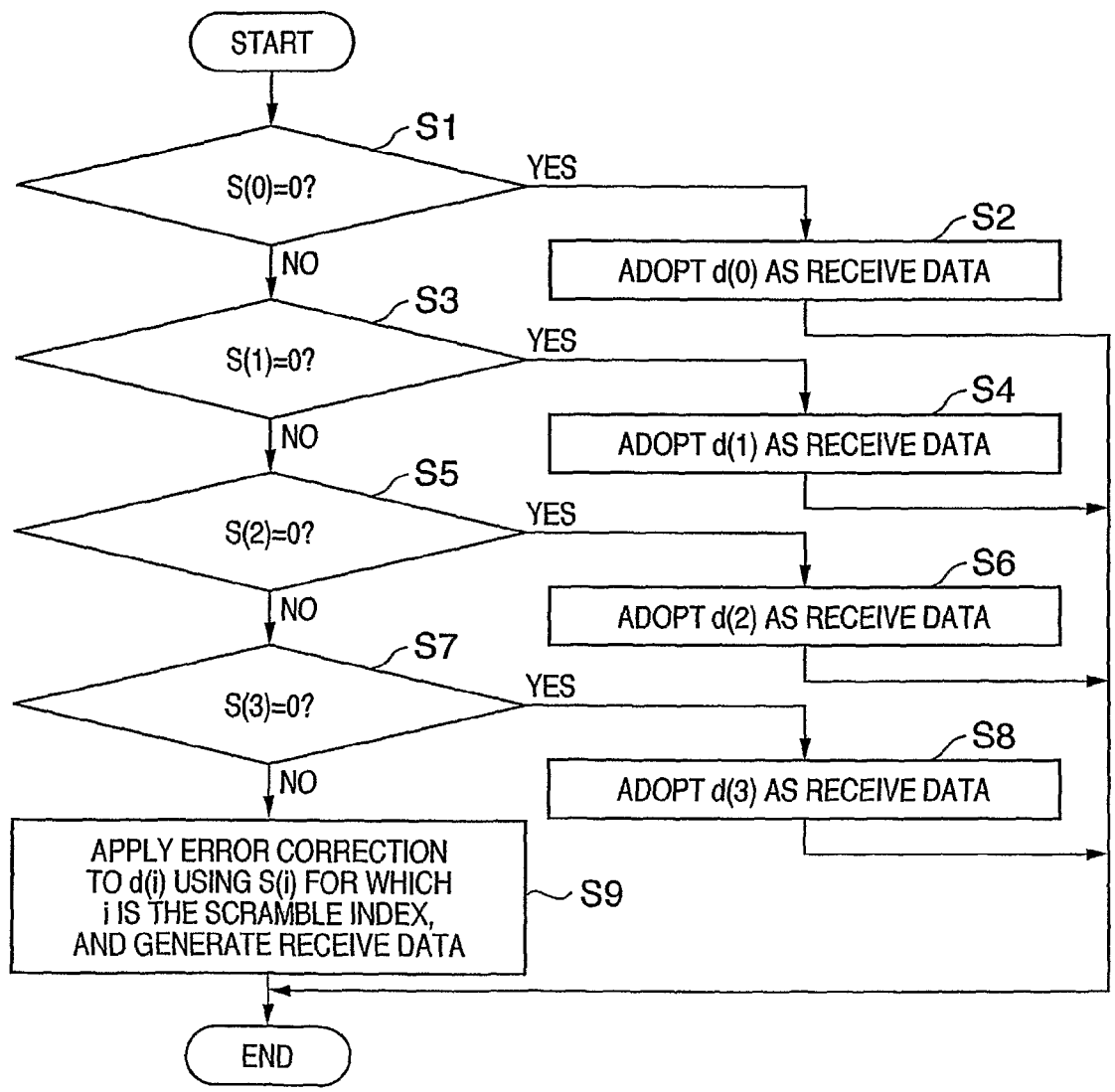
FIG. 2 is a flowchart for describing processing in an error correction unit according to this embodiment.
Figure 3:
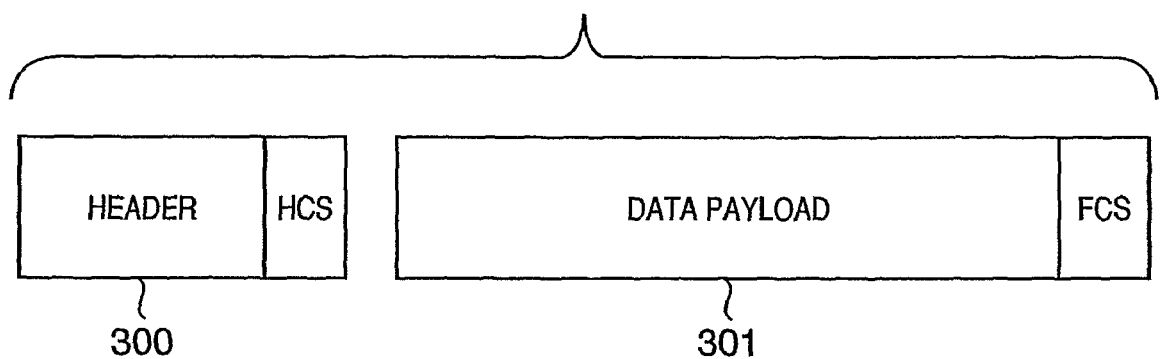
FIG. 3 is a diagram illustrating the structure of a wireless frame in a WPAN system proposed as an MBOA specification.
Figure 4:
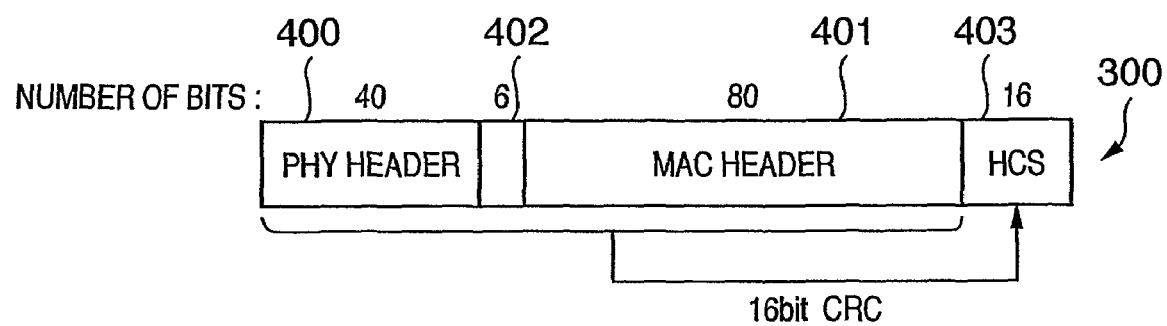
FIG. 4 is a diagram useful in describing the details of a header contained in a wireless frame in a WPAN system proposed as an MBOA specification.
Figure 5:
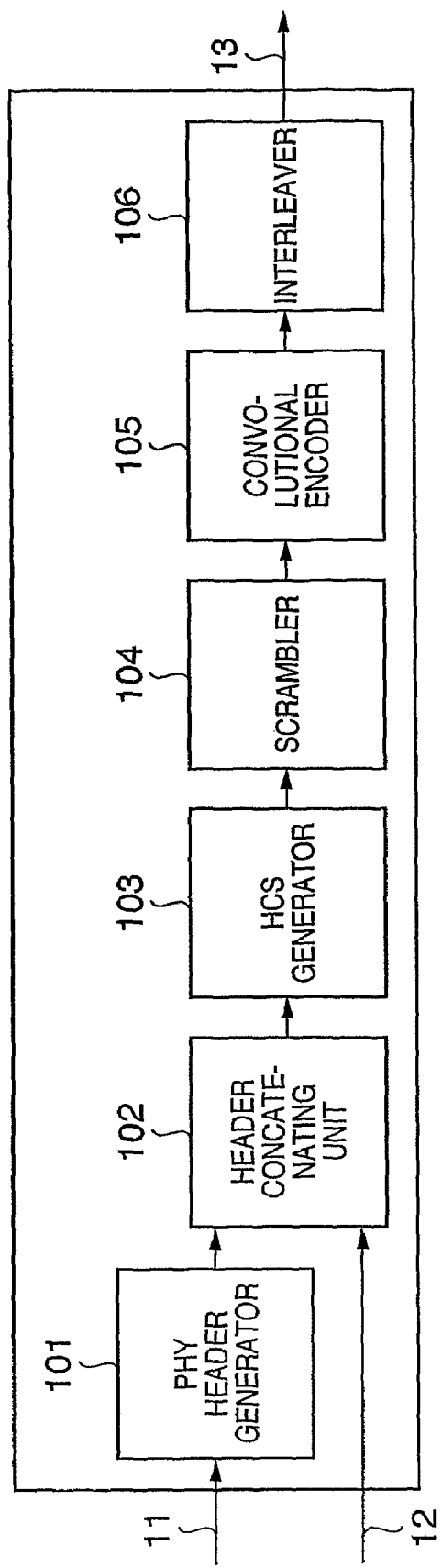
FIG. 5 is a block diagram useful in describing the structure of a transmit-side codec in a WPAN wireless communication system compliant with MBOA specifications.
Figure 7:
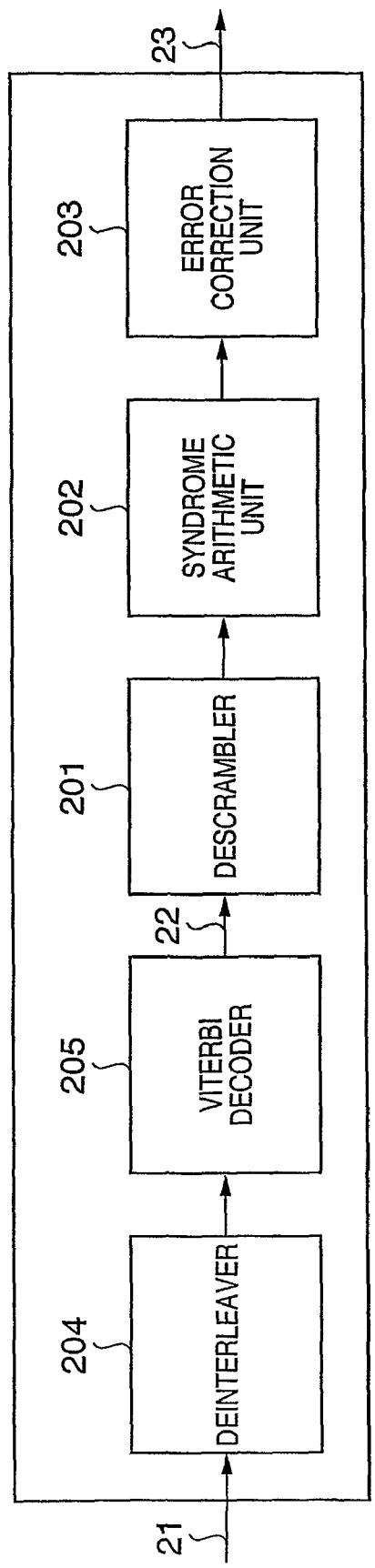
FIG. 7 is a diagram illustrating the structure of a conventional receive-side codec in a WPAN wireless communication system compliant with MBOA specifications.
Figure 9A:
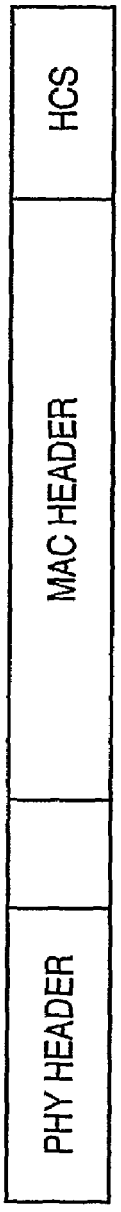
FIGS. 9A to 9D are diagrams for describing a case where error correction cannot be performed correctly using a CRC code employing the conventional codec.
Figure 9B:
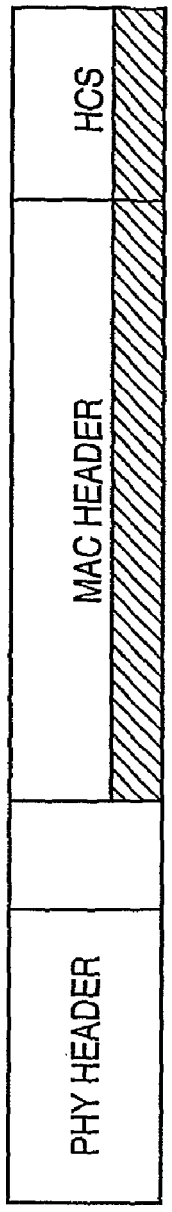
Figure 9C:
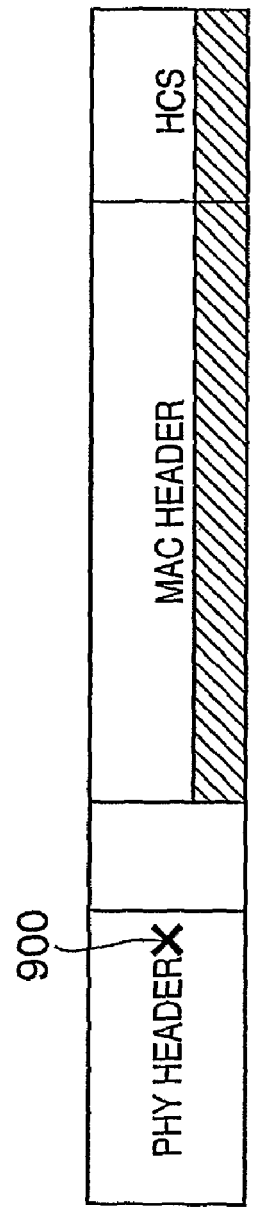
Figure 9D:
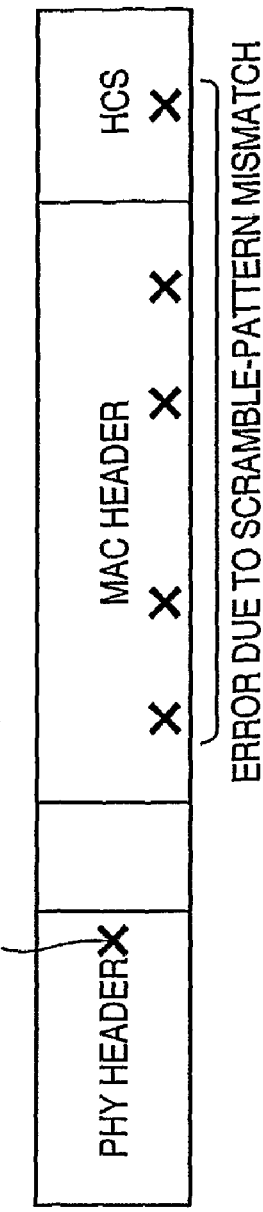

FIG. 2 is a flowchart for describing processing in the error correction unit 303 according to this embodiment.

First, at step S1, the error correction unit 303 determines whether the syndrome S(0) that is output from the syndrome arithmetic unit 302a is "0". If the syndrome is "0", control proceeds to step S2, at which the descrambled data d(0) that is output from the first descrambler 301a is adopted as receive data. If it is found at step S1 that the syndrome S(0) is not "0", then control proceeds to step S3. Here the error correction unit 303 determines whether the syndrome S(1) that is output from the syndrome arithmetic unit 302b is "0". If the syndrome is "0", control proceeds to step S4, at which the descrambled data d(1) that is output from the second descrambler 301b is adopted as receive data. If it is found at step S3 that the syndrome S(1) is not "0", then control proceeds to step S5. Here the error correction unit 303 determines whether the syndrome S(2) that is output from the syndrome arithmetic unit 302c is "0". If the syndrome is "0", control proceeds to step S6, at which the descrambled data d(2) that is output from the third descrambler 301c is adopted as receive data. If it is found at step S5 that the syndrome S(2) is not "0", then control proceeds to step S7. Here the error correction unit 303 determines whether the syndrome S(3) that is output from the syndrome arithmetic unit 302d is "0". If the syndrome is "0", control proceeds to step S8, at which the descrambled data d(3) that is output from the fourth descrambler 301d is adopted as receive data. If it is found at step S7 that the syndrome S(3) is not "0", then control proceeds to step S9. Here the error correction unit 303 construes that the value (i: i=0~3, a~d) indicated by the scramble index field (PHY header) contained in the decoded data D is correct, and subjects the descrambled data [d(i)] that is output from the descrambler 301i to error correction using the syndrome [S(i)] that is output from the syndrome arithmetic unit 302i corresponding to this value, thereby obtaining the receive data.

Thus, in the first half of the flowchart of FIG. 2, first an investigation is made to determine whether there is a "0" among the four syndromes S(0), S(1), S(2), S(3). If a "0" syndrome exists, then, regardless of whether an error exists in the scramble index field of the decoded data D, a maximum-likelihood determination can be made that the scramble index of the transmitted data is the index of this "0" syndrome. That is, if S(1)=0 holds, for example, then the scramble index field of the transmitted data is "1". Furthermore, since S(1)=0 holds, a judgment can be rendered that no error exists in a field other than the scramble index field of the header that undergoes the HCS check. Accordingly, in a case where S(1)=0 holds, the second descrambled data d(1) can be adopted as is as the receive data 23 error-corrected by the error correction unit 303. The receive data 23 thus obtained is sent to the MAC processor as data correctly received in the PHY processor. The same is true also in a case where another syndrome S(i) is "0".

Described next will be the latter half of the flowchart (algorithm) of FIG. 2, namely a case where none of the values of syndromes S(0), S(1), S(2), S(3) is "0". The error correction capability of HCS in the MBOA specifications is limited to errors that are single-bit errors. Accordingly, in the event that an error exists in the scramble index field, the error is corrected by the first half of this algorithm. If it is assumed that an error falls within the limits of the HCS error correction capability, then, in the event that none of the values of the four syndromes S(0), S(1), S(2), S(3) is "0", it can be construed that an error exists in a bit of other than the scramble index field. Accordingly, the value indicated by the scramble index field contained in the decoded data D is adopted as being correct.

Accordingly, in the latter half of the algorithm, if the scramble index field is "0", for example, the error correction unit 303 selects the descrambled data d(0) and syndrome S(0) corresponding to the scramble index "0". The error correction unit 303 then performs an operation similar to that of the error detection/correction unit that employs the CRC code in the prior art, applies error correction to d(0) using the syndrome value S(0) and adopts the result as the error-corrected receive data 23.

Thus, in a case where none of the syndromes is "0", error correction by the CRC code is performed using the descrambled data d(i) and syndrome S(i) corresponding to the value (i) designated by the scramble index field contained in the decoded data D. As a result, an error that has occurred in a bit of other than the scramble index field can be corrected.

Although this embodiment has been described with regard to a codec, the above-described arrangement can be adopted in a decoder that decodes a received data frame. Further, it is possible to construct a wireless module in which the codec or decoder is combined with a microprocessor and memory, etc. It is, furthermore, possible to construct a wireless communication unit by combining the wireless module with other modules.

Thus, in accordance with the codec according to this embodiment, as described above, maximum-likelihood decoding is performed based upon results from a plurality of descramblers and syndrome arithmetic units. In order to apply a correction to an error that has occurred, error correction using a CRC-code characteristic is performed.

As a result, error correction can be performed correctly even with regard to an error that has occurred in a scramble index field. With the codecs of the prior art, such an error correction is not possible owing to mismatch between scramble patterns. As the result, it is possible to provide with a wireless communication system in which a loss rate of a wireless frame is small and throughput of the wireless communication is enhanced.

There are cases where the object of the invention is attained by supplying a software program, which implements the functions of the foregoing embodiment, directly or remotely to a system or apparatus, reading the supplied program codes with a computer of the system or apparatus, and then executing the program codes. In this case, so long as the system or apparatus has the functions of the program, the mode of implementation need not rely upon a program. Accordingly, since the functional processing of the present invention is implemented by computer, the program codes per se installed in the computer also implement the present invention. In other words, the present invention also covers a computer program that is for the purpose of implementing the functional processing of the present invention. In this case, so long as the system or apparatus has the functions of the program, the form of the program, e.g., object code, a program executed by an interpreter or print data supplied to an operating system, etc., does not matter.

Examples of storage media that can be used for supplying the program are a Floppy (registered trademark) disk, hard disk, optical disk, magneto-optical disk, CD-ROM, CD-R, CD-RW, magnetic tape, non-volatile type memory card, ROM, DVD (DVD-ROM, DVD-R), etc. As for the method of supplying the program, the client computer can be connected to a website on the Internet using a browser possessed by the client computer, and the computer program per se of the present invention or an automatically installable compressed file of the program can be downloaded to a storage medium such as a hard disk. Further, the program of the present invention can be supplied by dividing the program code constituting the program into a plurality of files and downloading the files from different websites. In other words, a WWW server that downloads, to multiple users, the program files that implement the functions of the present invention by computer also is covered by the claims of the present invention.

Further, it is also possible to encrypt and store the program of the present invention on a storage medium such as a CD-ROM, distribute the storage medium to users, allow users who meet certain requirements to download decryption key information from a website via the Internet, and allow these users to run the encrypted program by using the key information, whereby the program is installed in the user computer.

Furthermore, besides the case where the aforesaid functions according to the embodiment are implemented by executing the read program by computer, an operating system or the like running on the computer may perform all or a part of the actual processing so that the functions of the foregoing embodiment can be implemented by this processing.

Furthermore, after the program read from a recording medium is written to a memory provided on function expansion board inserted into the computer or provided in a function expansion unit connected to the computer, a CPU or the like mounted on the function expansion board or function expansion unit performs all or a part of the actual processing so that the functions of the foregoing embodiment can be implemented by this processing.

The present invention is not limited to the above embodiment and various changes and modifications can be made within the spirit and scope of the present invention. Therefore, to apprise the public of the scope of the present invention, the following claims are made.

This application is a National Stage application filed under 35 U.S.C. 371 of International Application No PCT/JP2006/309202 filed Apr. 27, 2006 which claims priority from Japanese Patent Application No. 2005-146985 filed on May 19, 2005, all of which are hereby incorporated by reference herein in their entirety.

The invention claimed is:

1. A communication apparatus for communicating a frame having a header that includes a first header portion and a second header portion for scrambling, the apparatus comprising:
   a plurality of descramblers, each of which is configured to apply different descrambling processing to the second header portion of a received frame;
   a determination unit configured to determine whether or not there is an error in respective headers descrambled by respective ones of the plurality of descramblers; and
   a selector configured to, in a case that the determination unit determines that there is no error in at least one the respective headers descrambled by respective one of the plurality of descramblers, select a header having no error, and in a case that the determination unit determines that there is an error in any one the respective headers descrambled by respective one of the plurality of descramblers, select a header that has been descrambled by one descrambler corresponding to a scramble index included in the first header portion among the plurality of descramblers.

2. The apparatus according to claim 1, wherein the first header portion is a PHY header and the second header portion is a MAC header.

3. The apparatus according to claim 1, wherein the determination unit performs a syndrome calculation with respect to the respective headers descrambled by respective ones of the plurality of descramblers and determines whether or not the respective headers have an error.

4. The apparatus according to claim 3, wherein the determination unit performs a syndrome calculation that is in accordance with cyclic redundancy check code based upon a checksum contained in the header and determines whether or not the respective headers have an error.

5. The apparatus according to claim 1, wherein said plurality of descramblers subjects the second header portion to descrambling processing using respective ones of pseudo-random sequences that are different from one another.

6. The apparatus according to claim 1, wherein the frame includes the header and a data payload.

7. A method of receiving a frame having a header that includes a first header portion and a second header portion for scrambling, the method comprising:
   applying different descrambling processing to the second header portion of a received frame;
   determining whether or not there is an error in respective headers descrambled in respective ones of different descrambling processes; and
   in a case that it is determined in the determining that there is no error in at least one the respective headers descrambled in respective one of the different descrambling process, selecting a header having no error, and in a case that it is determined in the determining that there is an error in any one the respective headers descrambled in respective one of the different descrambling processes, selecting a header that has been descrambled in one descrambling process corresponding to a scramble index included in the first header portion.

8. The method according to claim 7, wherein the first header portion is a PHY header and the second header is a MAC header.

9. The method according to claim 7, wherein the determining performs a syndrome calculation with respect to the respective headers descrambled in respective ones of the descrambling processes and determines whether or not the respective headers have an error.

10. The method according to claim 7, wherein the determining performs a syndrome calculation that is in accordance with a cyclic redundancy check code based upon a checksum contained in the header and determines whether or not the respective headers have an error.

11. The method according to claim 7, wherein said plurality of descrambling steps subjects the second header portion to descrambling processing using respective ones of pseudorandom sequences that are different from one another.

12. The method according to claim 7, wherein the frame includes the header and a data payload.

13. A codec for decoding a frame having a header that includes a first header portion and a second header portion for scrambling, the codec comprising:
  a plurality of descramblers, each of which is configured to apply different descrambling processing to the second header portion of a received frame;
  a plurality of syndrome arithmetic units configured to perform a syndrome calculation with respect to headers descrambled by respective ones of said plurality of descramblers; and
  a selector configured to select, in a case that any one of syndrome values calculated by the plurality of syndrome arithmetic units is a prescribed syndrome value, output from a descrambler corresponding to a syndrome arithmetic unit that has calculated the prescribed syndrome value, and to select, in a case that any one of syndrome values calculated by the plurality of syndrome arithmetic units is not the prescribed syndrome value, a header that has been descrambled by a descrambler corresponding to a scramble index included in the first header portion.

14. A decoder for decoding a frame having a header that includes a first header portion and a second header portion for scrambling, the decoder comprising:
  a plurality of descramblers, each of which is configured to applying different descrambling processing to the second header portion of a received frame;
  a plurality of syndrome arithmetic units configured to perform a syndrome calculation with respect to headers descrambled by respective ones of said plurality of descramblers; and
  a selector configured to select, in a case that any one of syndrome values calculated by the plurality of syndrome arithmetic units is a prescribed syndrome value, output from a descrambler corresponding to a syndrome arithmetic unit that has calculated the prescribed syndrome value, and to select, in a case that any one of syndrome values calculated by the plurality of syndrome arithmetic units is not the prescribed syndrome value, a header that has been descrambled by a descrambler corresponding to a scramble index included in the first header portion.

15. A communication module for decoding a frame having a header that includes a first header portion and a second header portion for scrambling, the communication module comprising:
  a plurality descramblers, each of which is configured to apply different descrambling processing to the second header portion of a received frame;
  a plurality of syndrome arithmetic units configured to perform a syndrome calculation with respect to headers descrambled by respective ones of said plurality of descramblers; and
  a selector configured to select, in a case that any one of syndrome values calculated by the plurality of syndrome arithmetic units is a prescribed syndrome value, output from a descrambler corresponding to a syndrome arithmetic unit that has calculated the prescribed syndrome value, and to select, in a case that any one of syndrome values calculated by the plurality of syndrome arithmetic units is not the prescribed syndrome value, a header that has been descrambled by a descrambler corresponding to a scramble index included in the first header portion.

16. A communication unit, which is composed of a plurality of modules, for decoding a frame having a header that includes a first header portion and a second header portion for scrambling, the communication unit comprising:
  a plurality of descramblers, each of which is configured to apply different descrambling processing to the second header portion of a received frame;
  a plurality of syndrome arithmetic units configured to perform a syndrome calculation with respect to headers descrambled by respective ones of said plurality of descramblers; and
  a selector configured to select, in a case that any one of syndrome values calculated by the plurality of syndrome arithmetic units is a prescribed syndrome value, output from a descrambler corresponding to a syndrome arithmetic unit that has calculated the prescribed syndrome value, and to select, in a case that any one of syndrome values calculated by the plurality of syndrome arithmetic units is not the prescribed syndrome value, a header that has been descrambled by a descrambler corresponding to a scramble index included in the first header portion.

17. A decoding method for decoding a frame having a header that includes a first header portion and a second header portion for scrambling, the method comprising:
  applying different descrambling processing to the second header portion of a received frame;
  performing a syndrome calculation with respect to headers descrambled in respective ones of the different descrambling processing; and
  selecting, in a case that any one of syndrome values calculated in the syndrome calculation is a prescribed syndrome value, a header for which result of calculation is the prescribed syndrome value, and selecting, in a case that any one of syndrome values calculated in the syndrome calculation is not the prescribed syndrome value, a header that has been descrambled in a descrambling process corresponding to a scramble index included in the first header portion.

* * * * *